United States Patent
Choi et al.

(10) Patent No.: US 10,373,973 B2
(45) Date of Patent: Aug. 6, 2019

(54) METHOD OF MANUFACTURING SEMICONDUCTOR DEVICE THROUGH BY-PRODUCT REMOVAL FROM CONDUCTIVE LAYER

(71) Applicant: SK hynix Inc., Gyeonggi-do (KR)

(72) Inventors: Won Joon Choi, Seoul (KR); Min Sung Ko, Gyeonggi-do (KR); Kyeong Bae Kim, Chungcheongbuk-do (KR); Jong Gi Kim, Gyeonggi-do (KR); Dong Sun Sheen, Gyeonggi-do (KR); Jung Myoung Shim, Gyeonggi-do (KR); Young Ho Yang, Chungcheongbuk-do (KR); Hyeng Woo Eom, Incheon (KR); Kwang Wook Lee, Gyeonggi-do (KR); Woo Jae Chung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/961,143

(22) Filed: Apr. 24, 2018

(65) Prior Publication Data
US 2019/0081066 A1    Mar. 14, 2019

(30) Foreign Application Priority Data

Sep. 11, 2017    (KR) .......................... 10-2017-0116009

(51) Int. Cl.
*H01L 27/11582*    (2017.01)
*H01L 21/28*    (2006.01)
*H01L 21/3213*    (2006.01)

(52) U.S. Cl.
CPC .. *H01L 27/11582* (2013.01); *H01L 21/28282* (2013.01); *H01L 21/28247* (2013.01); *H01L 21/32134* (2013.01)

(58) Field of Classification Search
None
See application file for complete search history.

(56) References Cited

U.S. PATENT DOCUMENTS

| 9,070,581 | B2 * | 6/2015 | Son ................. H01L 27/11578 |
| 2014/0349477 | A1 * | 11/2014 | Chandrashekar ........................ H01L 21/76877 438/627 |
| 2017/0062286 | A1 * | 3/2017 | Ito .......................... H01L 22/26 |

FOREIGN PATENT DOCUMENTS

| KR | 100648252 | 11/2006 |
| KR | 1020160140448 | 12/2016 |

* cited by examiner

*Primary Examiner* — Andres Munoz
(74) *Attorney, Agent, or Firm* — IP & T Group LLP

(57) ABSTRACT

The method of manufacturing a semiconductor device include: forming conductive patterns in interlayer spaces between interlayer insulating layers, the conductive patterns being separated from each other by a slit passing through the interlayer insulating layers, wherein the conductive patterns include a first by-product; generating a second by-product of a gas phase by reacting the first by-product remaining in the conductive patterns with source gas; and performing an out-gassing process to remove the second by-product.

19 Claims, 9 Drawing Sheets

METHOD OF MANUFACTURING SEMICONDUCTOR DEVICE THROUGH BY-PRODUCT REMOVAL FROM CONDUCTIVE LAYER

CROSS-REFERENCE TO RELATED APPLICATION

The present application claims priority under 35 U.S.C. § 119(a) to Korean patent application number 10-2017-0116009 filed on Sep. 11, 2017, the entire disclosure of which is incorporated herein by reference.

BACKGROUND

Field of Invention

Various embodiments of the present disclosure generally relate to a semiconductor device, and more particularly, to a semiconductor device including a conductive pattern, and a method of manufacturing the semiconductor device.

Description of Related Art

A semiconductor device typically includes a plurality of conductive patterns. A method of forming the conductive patterns may include a step of depositing a conductive layer on a substrate using a chemical vapor deposition (CVD) method, an atomic layer deposition (ALD) method, or the like. During the deposition step of the conductive layer, a void may be formed in the conductive layer because of various reasons. Voids remain in the conductive patterns may cause malfunction of the semiconductor device.

SUMMARY

An embodiment of the present disclosure provides a method of manufacturing a semiconductor device, including: forming conductive patterns in interlayer spaces between interlayer insulating layers, the conductive patterns being separated from each other by a slit passing through the interlayer insulating layers, wherein the conductive patterns include a first by-product; generating a second by-product of a gas phase by reacting the first by-product remaining in the conductive patterns with source gas; performing an out-gassing process to remove the second by-product; and filling the slit with a sealing insulating layer so that the conductive patterns are sealed in the interlayer spaces.

An embodiment of the present disclosure provides a method of manufacturing a semiconductor device, including: forming interlayer insulating layers penetrated by a slit and stacked and spaced apart from each other with an interlayer space interposed therebetween; depositing a conductive layer with which the interlayer space is filled, wherein the conductive layer is deposited at a first temperature; removing a portion of the conductive layer in the slit through an etching process such that the conductive layer remains as a conductive pattern within the interlayer space; reacting a first by-product remaining in the conductive pattern with source gas at a second temperature higher than the first temperature to form a second by-product of a gas phase; and performing an out-gassing process to remove the second by-product.

An embodiment of the present disclosure provides a method of manufacturing a semiconductor device, including: forming conductive layers in interlayer spaces between interlayer insulating layers, wherein the conductive layers include a first by-product; generating a second by-product of a gas phase by reacting the first by-product remaining in the conductive layers with source gas; and performing an out-gassing process to remove the second by-product.

These and other features and advantages of the present disclosure will become apparent to those skilled in the art to which the present invention belongs or relates from the following detailed description in conjunction with the accompanying drawings.

DETAILED DESCRIPTION

Example embodiments of the present invention will now be described more fully hereinafter with reference to the accompanying drawings; however, it is noted that they may be embodied in different forms and should not be construed as limited to the embodiments set forth herein. Rather, these embodiments are provided so that this disclosure will be thorough and complete, and will fully convey the scope of the example embodiments to those skilled in the art.

Various embodiments of the present disclosure provide a method of manufacturing a semiconductor device having a structure capable of reducing a defect rate of conductive patterns.

Figure 1A:
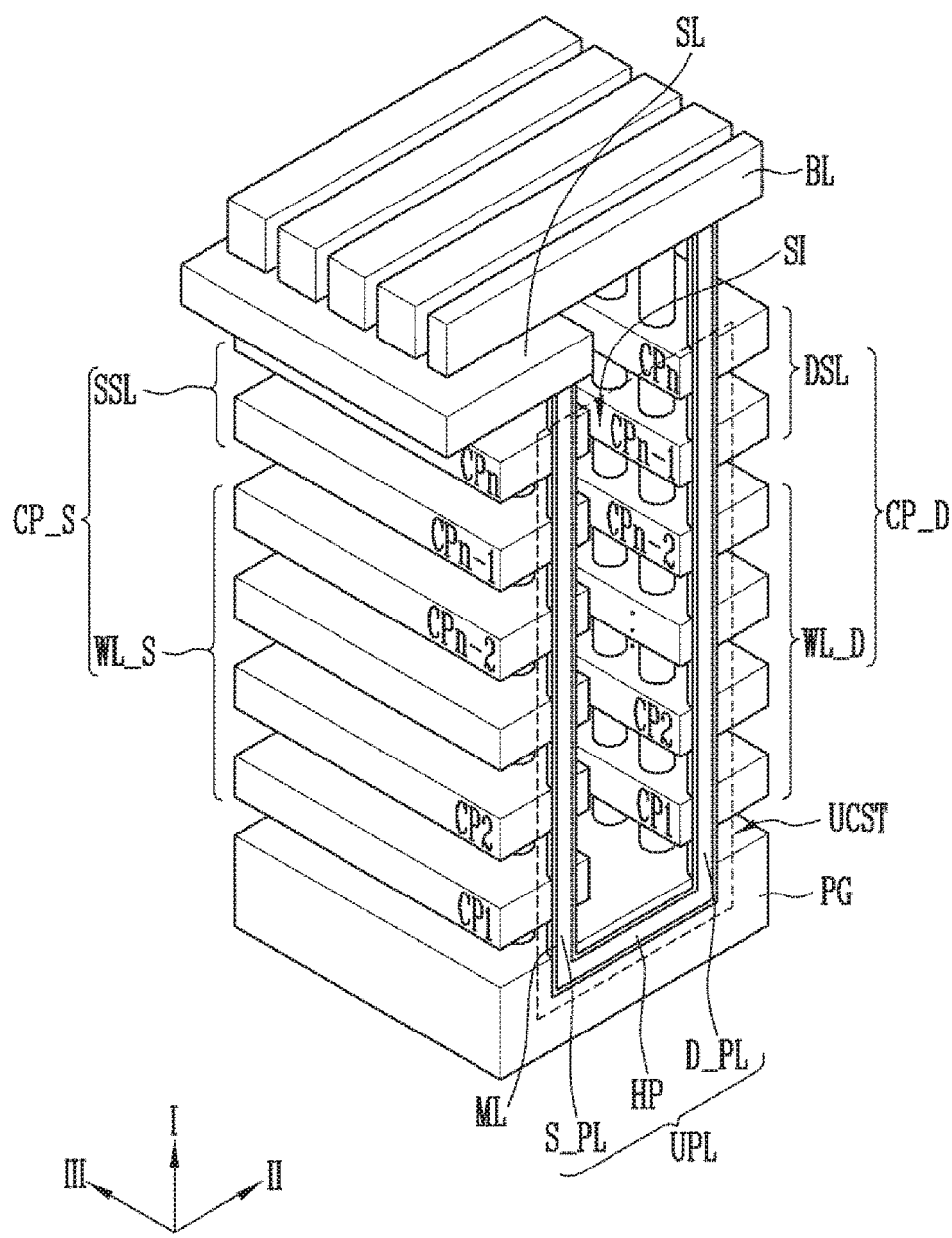
FIGS. 1A to 1C are perspective views illustrating embodiments of a semiconductor device in accordance with the present disclosure.
Figure 1B:
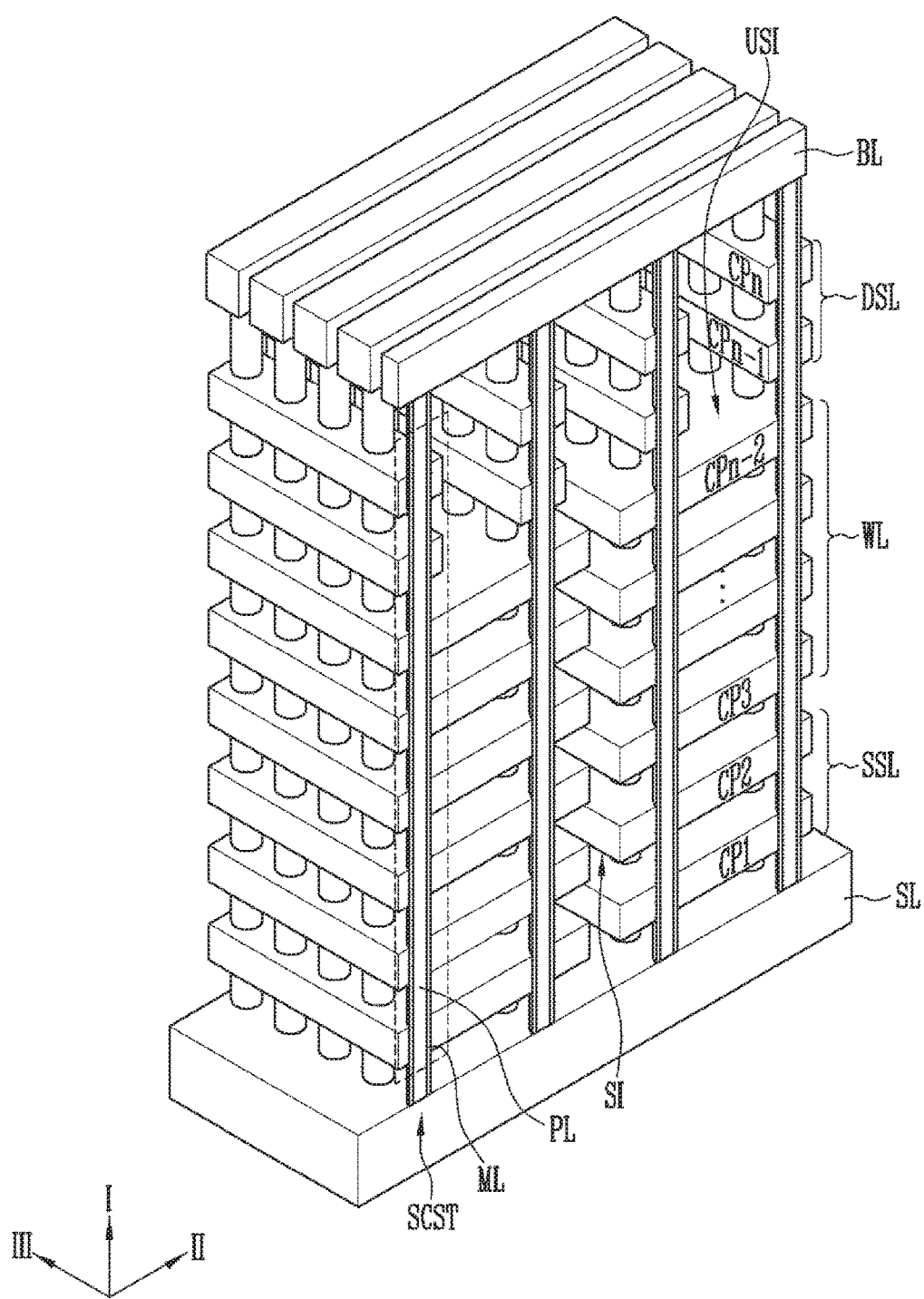
Figure 1C:
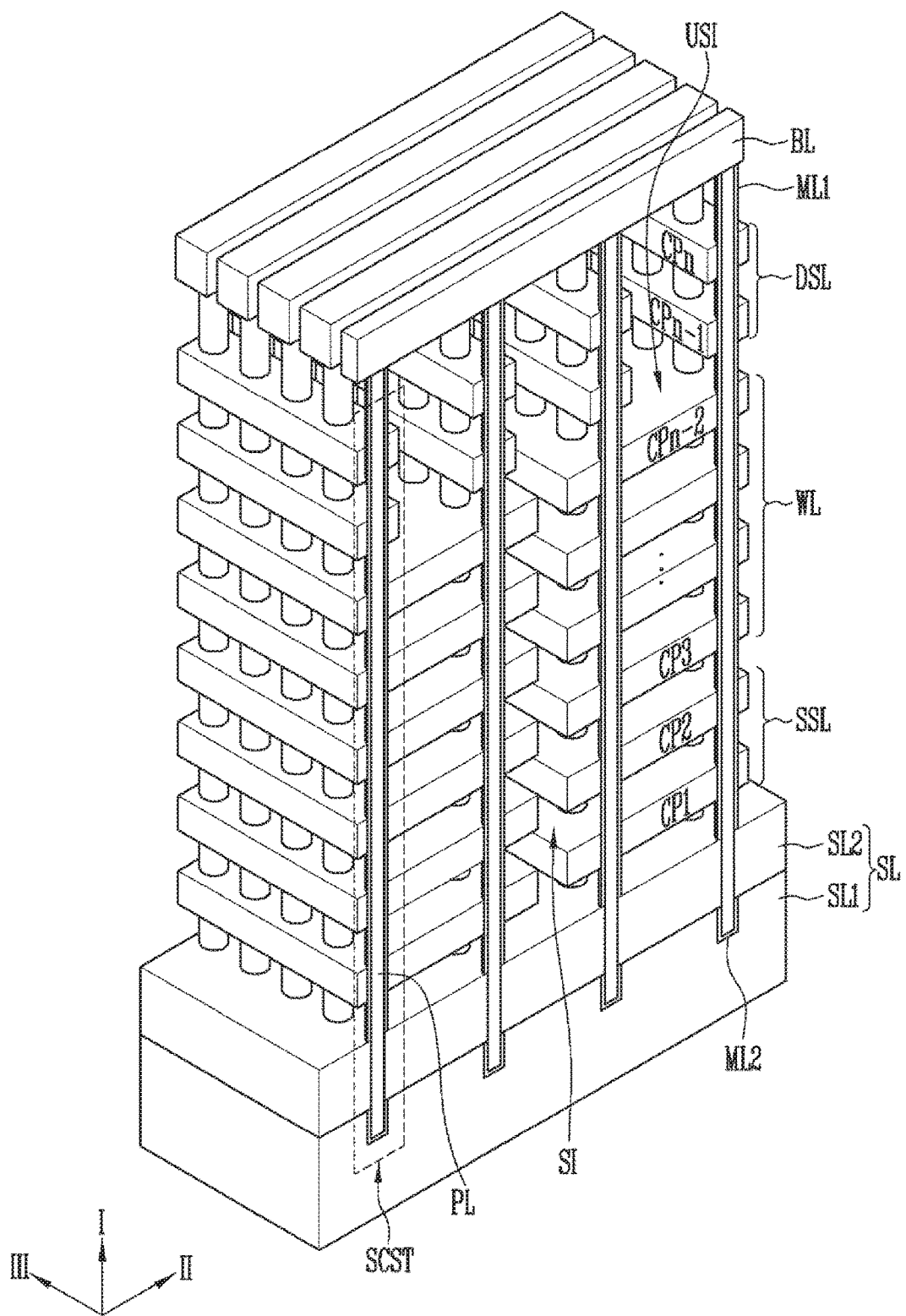

FIGS. 1A to 1C are perspective views illustrating embodiments of a semiconductor device in accordance with the present disclosure. For the sake of recognition of conductive patterns in the drawings, interlayer insulating layers are not shown in FIGS. 1A to 1C.

Referring to FIGS. 1A to 1C, a semiconductor device in accordance with an embodiment of the present disclosure may include a three-dimensional memory string UCST or SCST. The three-dimensional memory string UCST or SCST may enhance the degree of integration of the semiconductor device. For example, the three-dimensional memory string UCST or SCST may be formed in a U shape, as shown in FIG. 1A, or in a straight shape, as shown in FIGS. 1B and 1C.

Referring to FIG. 1A, a U-type memory string UCST may include memory cells and select transistors which are arranged along a U-type cell pillar UPL. The memory cells and the select transistors may be coupled to source side conductive patterns CP_S and drain side conductive patterns CP_D. The source side conductive patterns CP_S may be spaced apart from the drain side conductive patterns CP_D by a slit SI.

The cell pillar UPL may be divided into a horizontal part HP, a source side pillar S_PL, and a drain side pillar DP_L which are coupled to each other. The horizontal part HP is embedded in a pipe gate PG. The source side pillar S_PL and the drain side pillar D_PL are extending from the horizontal part HP in a first direction I. The cell pillar UPL may be formed of a channel layer having the same shape as that of the cell pillar UPL. In an embodiment, the cell pillar UPL may include a core insulating layer with which a central region of a U-type hole is filled, and a channel layer enclosing the core insulating layer. A multilayer ML may be further formed on an outer surface of the cell pillar UPL. The multilayer ML may extend along the outer surface of the cell pillar UPL. The structure of the core insulating layer, the channel layer, and the multilayer ML will be described in more detail with reference to FIG. 2.

The cell pillar UPL may be electrically coupled between a source line SL and a bit line BL. For example, the source line SL and the bit line BL may be electrically coupled to the channel layer of the cell pillar UPL. The bit line BL and the source line SL are disposed at different layers and spaced apart from each other. For example, the source line SL may be disposed below the bit line BL. The source line SL may be electrically coupled to an upper end of the source side pillar S_PL. A source contact plug may be formed between the source line SL and the source side pillar S_PL. The bit line BL may be electrically coupled to an upper end of the drain side pillar D_PL. A drain contact plug may be formed between the bit line BL and the drain side pillar D_PL.

The source side conductive patterns CP_S may include n conductive patterns (CP1 to CPn: n is a natural number of 2 or more) that are stacked below the source line SL in the first direction I and spaced apart from each other. The drain side conductive patterns CP_D may include n conductive patterns (CP1 to CPn) that are stacked below the bit line BL in the first direction I and spaced apart from each other. The drain side conductive patterns CP_D may be disposed at the same level with corresponding source side conductive patterns CP_S.

The source side conductive patterns CP_S may enclose the source side pillar S_PL and be stacked and spaced apart from each other. The source side conductive patterns CP_S may include source side word lines WL_S and a source select line SSL. The source select line SSL may be disposed over the source side word lines WL_S. The source select lines SSL having a single-layer or two- or more layer structure may be disposed between the source side word lines WL_S and the source line SL. Although, in the drawing, there is illustrated an example in which the source select line SSL is configured with an n-th pattern CPn that is disposed at an uppermost layer of the source side conductive patterns CP_S and an n−1-th pattern CPn−1 disposed below the n-th pattern CPn, the present disclosure is not limited to this.

The drain side conductive patterns CP_D may enclose the drain side pillar PL and be stacked and spaced apart from each other. The drain side conductive patterns CP_D may include drain side word lines WL_D and a drain select line DSL. The drain select line DSL may be disposed over the drain side word lines WL_D. The drain select line DSL may have a single layered or two or more layered structure between the drain side word lines WL_D and the bit line BL. Although, in the drawing, there is illustrated an example in which the drain select line DSL is configured with an n-th pattern CPn that is disposed at an uppermost layer of the drain side conductive patterns CP_D and with an n−1-th pattern CPn−1 disposed below the n-th pattern CPn, the present disclosure is not limited to this.

The slit SI may be formed between the source side conductive patterns CP_S and the drain side conductive patterns CP_D that are adjacent to each other in a second direction II, and may extend in a third direction III. The second direction II intersects with the third direction III, and a plane extending in the second direction II and the third direction III intersects with the first direction I. Each of the source side conductive patterns CP_S, the drain side conductive patterns CP_D, and the source line SL may extend in the third direction III. The bit line BL may extend in the second direction II.

The pipe gate PG may be disposed below the source side conductive patterns CP_S and the drain side conductive patterns CP_and formed to enclose the horizontal part HP. The pipe gate PG may be disposed below the conductive patterns CP1 to CPn.

Source side memory cells are formed at intersections between the source side pillar S_PL and the source side word lines WL_S, and drain side memory cells are formed at intersections between the drain side pillar D_PL and the drain side word lines WL_D. A source select transistor is formed at an intersection between the source side pillar S_PL and the source select line SSL, and a drain select transistor is formed at an intersection between the drain side pillar D_PL and the drain select line DSL. The pipe transistor is formed at an intersection between the horizontal part HP and the pipe gate PG. The source select transistor, the source side memory cells, the pipe transistor, the drain side memory cells, and the drain select transistor that are arranged along the U-type cell pillar UPL may be coupled in series through the channel layer included in the U-type cell pillar UPL. The source select transistor, the source side memory cells, the pipe transistor, the drain side memory cells, and the drain select transistor that are coupled in series define a U-type memory string UCST along the shape of the U-type cell pillar UPL. The source side word lines WL_S may transmit signals to gates of the source side memory cells. The drain side word lines WL_D may transmit signals to gates of the drain side memory cells. The source select line SSL may transmit a signal to the gate of the source select transistor. The drain select line DSL may transmit a signal to the gate of the drain select transistor. The pipe gate PG may transmit a signal to the gate of the pipe transistor. The pipe transistor may couple the source side memory cells and the drain side memory cells to each other, in response to a signal applied to the pipe gate PG.

The cell pillar may have various shapes including not only the above-mentioned U shape but also a W shape, etc. The arrangement of the memory cells may be changed in various shapes depending on the structure of the cell pillar. Thereby, the memory string structure may also have various shapes.

Referring to FIGS. 1B and 1C, a straight memory string SCST may include memory cells and select transistors which are stacked along straight cell pillars PL. Gates of the memory cells and gates of the select transistors may be coupled to corresponding conductive patterns CP1 to CPn. The conductive patterns CP1 to CPn are divided into word lines WL, source select lines SSL, and drain select lines DSL by slits SI and USI.

Each cell pillar PL may be formed of a channel layer having the same shape as that of the cell pillar PL. In an embodiment, the cell pillar PL may include a core insulating layer with which a central region of a straight hole is filled, and a channel layer enclosing the core insulating layer. An outer surface of the cell pillar PL may be enclosed by a multilayer ML, ML1 or ML2. The configuration of the core insulating layer, the channel layer, and the multilayer will be described later herein with reference to FIG. 2.

An upper end of the cell pillar PL may be electrically coupled to a bit line BL. For example, the channel layer of the cell pillar PL may be electrically coupled to the bit line BL. A drain contact plug (not shown) may be further formed between the bit line BL and the cell pillar PL.

The cell pillar PL may be coupled to a source layer SL. For example, the channel layer of the cell pillar PL may be coupled to the source layer SL. The source layer SL may have various structures.

Referring to FIG. 1B, the source layer SL may come into contact with the bottom surfaces of the cell pillars PL. The source layer SL may be formed of a doped polysilicon layer. Each cell pillar PL may come into contact with the top surface of the source layer SL and extend in a first direction I toward the bit line BL.

The multilayer ML may extend along a side surface of the cell pillar PL. A top surface and the bottom surface of the cell pillar PL may be open and not closed by the multilayer ML. The top surface of the cell pillar PL may be electrically coupled to the bit line BL, and the bottom surface of the cell pillar PL may be electrically coupled to the source layer SL.

Referring to FIG. 1C, the cell pillar PL may extend into the source layer SL. For example, in an embodiment, the source layer SL may have a stacked structure including a first source layer SL1 and a second source layer SL2. The first source layer SL1 may enclose the lower ends of the cell pillars PL. The second source layer SL2 may be disposed over the first source layer SL1 and be brought into contact with an upper surface of the first source layer SL1 and side surfaces of the cell pillars PL. The second source layer SL2 may enclose the cell pillars PL. An upper end of each cell pillar PL that protrudes from the second source layer SL2 in the first direction I may be enclosed by a first multilayer pattern ML1. A second multilayer pattern ML2 may be disposed between the first source layer SL1 and each cell pillar PL. The first multilayer pattern ML1 and the second multilayer pattern ML2 may include the same material layers. The first multilayer pattern ML1 and the second multilayer pattern ML2 may be separated from each other by the second source layer SL2.

Referring to FIGS. 1B and 1C, the conductive patterns CP1 to CPn may be disposed at n layers spaced apart from each other between the bit line BL and the source structure SL. The conductive patterns CP1 to CPn may enclose the cell pillars PL and be stacked and spaced apart from each other in the first direction I. The conductive patterns CP1 to CPn may include a source select line SSL, word lines WL and a drain select line DSL. The source select line SSL may be disposed over the source layer SL and may not contact the source layer SL. The word lines WL may be disposed over the source select lines SSL. The drain select line DSL may be disposed over the word lines WL.

The slits SI and USI may include a first slit SI that completely passes through the conductive patterns CP1 to CPn, and a second slit USI that passes only through one or more uppermost layers of the conductive patterns CP1 to CPn. The first slit SI and the second slit USL may extend in the third direction III.

Among the conductive patterns CP1 to CPn, some conductive patterns (e.g., CP3 to CPn−2) that are successively stacked may be divided into word lines WL by the first slit SI.

One or two layers of conductive patterns disposed between the word lines WL and the source layer SL may be divided into source select lines SSL by the first slit SI. Although, in the drawing, there is illustrated an example in which the source select line SSL is configured by a first pattern CP1 that is disposed at a lowermost layer of the conductive patterns CP1 to CPn and a second pattern CP2 disposed over the first pattern CP1, the present disclosure is not limited to this.

One or two layers of conductive patterns disposed between the word lines WL and the bit line BL may be divided into drain select lines DSL by the first slit SI and the second slit USI. Although, in the drawing, there is illustrated an example in which the drain select line DSL is configured by an n-th pattern CPn that is disposed at an uppermost layer of the conductive patterns CP1 to CPn and an n−1-th pattern CPn−1 disposed below the nth pattern CPn, the present disclosure is not limited to this.

The word lines WL, the drain select lines DSL, and the source select lines SSL may extend in the third direction III. The bit line BL may extend in the second direction II.

In an embodiment, first slits SI and second slits USI may alternate with each other in the second direction II. Each of the word lines WL may extend to overlap the corresponding second slit USI rather than being divided into parts by the second slit USI. Each of the word lines WL may enclose a plurality of cell pillar PL in common. The cell pillars PL that are enclosed in common by each of the word lines WL may be divided into bit groups each of which is enclosed by the corresponding drain select lines DSL. For example, the cell pillars PL enclosed in common by each of the word lines WL may be divided into a first bit group and a second bit group with the second slit USI interposed therebetween. The first bit group and the second bit group may be controlled by different drain select lines DSL.

According to the configuration described with reference to FIG. 1B and 1C, memory cells are formed at intersections between the cell pillars PL and the word lines WL, a drain select transistor is formed at an intersection between each cell pillar PL and the drain select line DSL, and a source select transistor is formed at an intersection between each cell pillar PL and the source select line SSL. The source select transistor, the memory cells and the drain select transistor that are arranged in a line along each cell pillar PL may be coupled in series to each other through the channel layer of the cell pillar PL and thus define a straight memory string SCST. The word lines WL may transmit signals to gates of the memory cells. The source select line SSL may transmit a signal to the gate of the source select transistor. The drain select line DSL may transmit a signal to the gate of the drain select transistor.

Each of the conductive patterns CP1 to CPn described with reference to FIGS. 1A to 1C may be disposed between interlayer insulating layers (not shown). The conductive patterns CP1 to CPn are sealed in interlayer space between the interlayer insulating layers by a sealing insulating layer (not shown) with which the slit SI is filled. According to the present disclosure, a manufacturing process is provided that minimizes or substantially prevents the occurrence of voids in each of the conductive patterns CP1 to CPn when sealed in the interlayer space by the sealing insulating layer. Voids in the conductive patterns CP1 to CPn may cause a bridge between the conductive patterns CP1 to CPn when contact plugs making contact with the contact patterns CP1 to CPn are formed. In the present disclosure, because the occurrence of voids which may cause defects is minimized or substantially prevented, the operating characteristics of the semiconductor device may be improved, and the semiconductor device may be operated more reliably. Detailed description of a method of manufacturing the semiconductor device in accordance with an embodiment of the present disclosure will be made later with reference to FIGS. 3A to 6.

Figure 2:
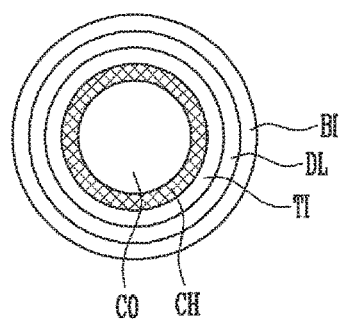
FIG. 2 is a diagram illustrating a cross-sectional structure of a cell pillar.

FIG. 2 is a diagram illustrating a cross-sectional structure of a cell pillar. The structure shown in FIG. 2 may correspond to the cross-section of the source side pillar S_PL, the drain side pillar D_PL, or the horizontal part HP shown in FIG. 1A or the cross-section of the cell pillar PL shown in FIGS. 1B and 1C.

Referring to FIG. 2, the core insulating layer CO described with reference to FIGS. 1A to 1C may be enclosed by the channel layer CH. The channel layer CH may be enclosed by the multilayer ML described with reference to FIGS. 1A and 1B or by the first multilayer pattern ML1 or the second multilayer pattern ML2 described with reference to FIG. 1C. The multilayer ML, the first multilayer pattern ML1 or the second multilayer pattern ML2 may each include a tunnel insulating layer TI enclosing the channel pattern CH, a data storage layer DL enclosing the tunnel insulating layer TI, and a blocking insulating layer BI enclosing the data storage layer DL. The data storage layer DL may be formed of a charge trap layer, a floating gate layer, conductive nanodots, a phase change layer, a variable resistance layer, etc. For example, the data storage layer may store data to be changed using the Fowler-Nordheim tunneling caused by a difference in voltage between the channel layer CH and the word lines WL1 to WLn shown in FIGS. 1A to 1C, and may be formed of a nitride layer capable of trapping charges. The blocking insulating layer BI may include an oxide layer capable of blocking charges. The tunnel insulating layer TI may be formed of a silicon oxide layer.

The channel layer CH may be formed of a semiconductor layer, e.g., a silicon layer.

FIGS. 3A to 3E are sectional views illustrating a method of manufacturing a semiconductor device according to an embodiment of the present disclosure. The method of manufacturing the semiconductor device shown in FIGS. 3A to 3E may be used to form the semiconductor device illustrated in FIGS. 1A to 1C.

Figure 3A:
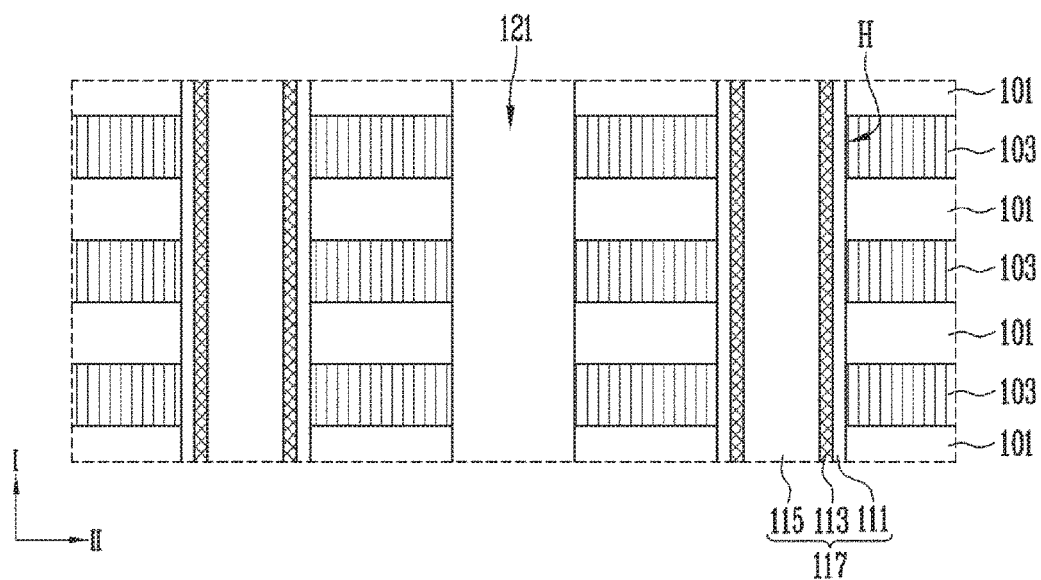
FIGS. 3A to 3E are sectional views illustrating a method of manufacturing a semiconductor device according to an embodiment of the present disclosure.

Referring to FIG. 3A, the interlayer insulating layers 101 and the sacrificial layers 103 are alternately stacked on a lower structure (not shown). The number of stacked layers including the interlayer insulating layers 101 and the sacrificial layers 103 may be set to various values by design. The interlayer insulating layers 101 and the sacrificial layers 103 are formed of different materials. For example, the sacrificial layers 103 may be made of a material having an etching rate that is different from that of the interlayer insulating layers 101. For example, the interlayer insulating layers 101 may be made of oxide layers, and the sacrificial layers 103 may be made of nitride layers having an etching rate different from that of the oxide layers.

The lower structure may include the pipe gate PG shown in FIG. 1A, the source layer SL shown in FIG. 1B, or the first source layer SL and a source sacrificial layer (not shown) shown in FIG. 1C.

Thereafter, the interlayer insulating layers 101 and the sacrificial layers 103 are etched so that holes H passing through them are formed. Subsequently, a cell pillar 117 is formed in each of the holes H. The step of forming the cell pillar 117 may include the step of forming a multilayer 111 on the surface of each hole H, and the step of forming a channel layer 113 on the multilayer 111. The multilayer 111 may be formed by successively stacking, on the surface of each hole H, the blocking insulating layer BI, the data storage layer DL, and the tunnel insulating layer TI that have been described with reference to FIG. 2. The channel layer CH may be formed of a semiconductor layer. For example, the channel layer CH may include a silicon layer. The channel layer 113 may be formed in a shape in which each hole H is completely filled with the channel layer 113, or in the form of a liner with an opening formed in a central portion of each hole H. In the case where the channel layer 113 is provided in the form of the liner, the step of forming the cell pillar 117 may further include the step of filling the central portion of each hole H with the core insulating layer 115.

Thereafter, a slit 121 passing through the interlayer insulating layers 101 and the sacrificial layers 103 is formed. The slit 121 may correspond to the slit SI shown in FIGS. 1A to 1C. The slit 121 may be formed by etching the interlayer insulating layers 101 and the sacrificial layers 103 between adjacent cell pillars 117.

Figure 3B:
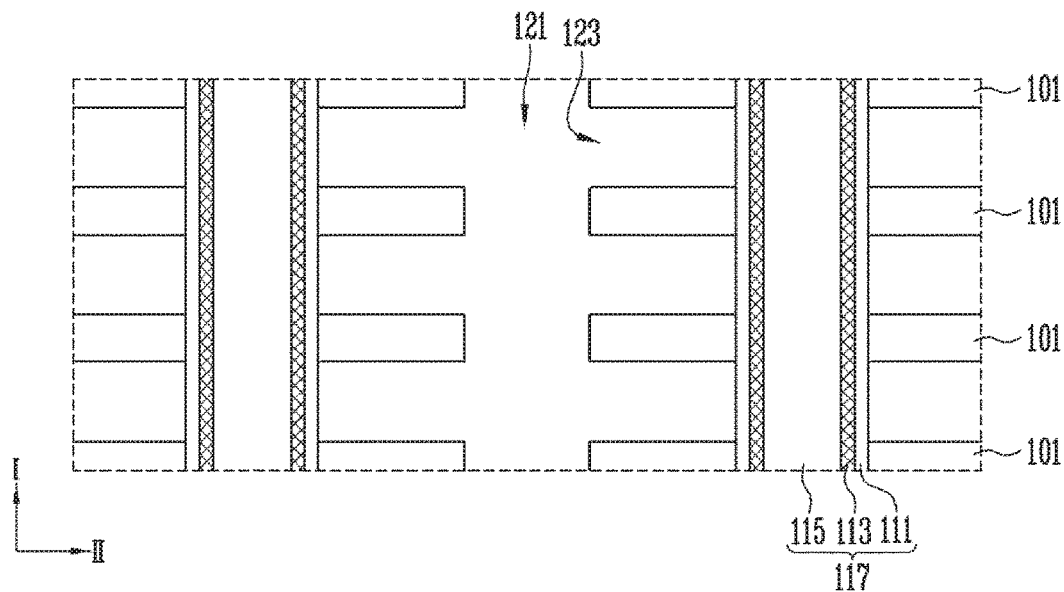

Referring to FIG. 3B, the sacrificial layers (103 of FIG. 3A) are removed through the slit 121. Here, the sacrificial layers 103 may be selectively removed using a difference in the etching rate between the sacrificial layers 103 and the interlayer insulating layers 101. For example, when the sacrificial layers 103 are formed of nitride layers, phosphoric acid may be used to selectively remove the sacrificial layers 103. Thereby, interlayer spaces 123 are formed between the interlayer insulating layers 101 that are adjacent to each other in the first direction I. To increase the area of each interlayer space 123, a portion of each interlayer insulating layer 101 may be further etched. The interlayer insulating layers 101 remain stacked at positions spaced apart from each other in the first direction I with the cell pillar 117 enclosed by the interlayer insulating layers 101.

Figure 3C:
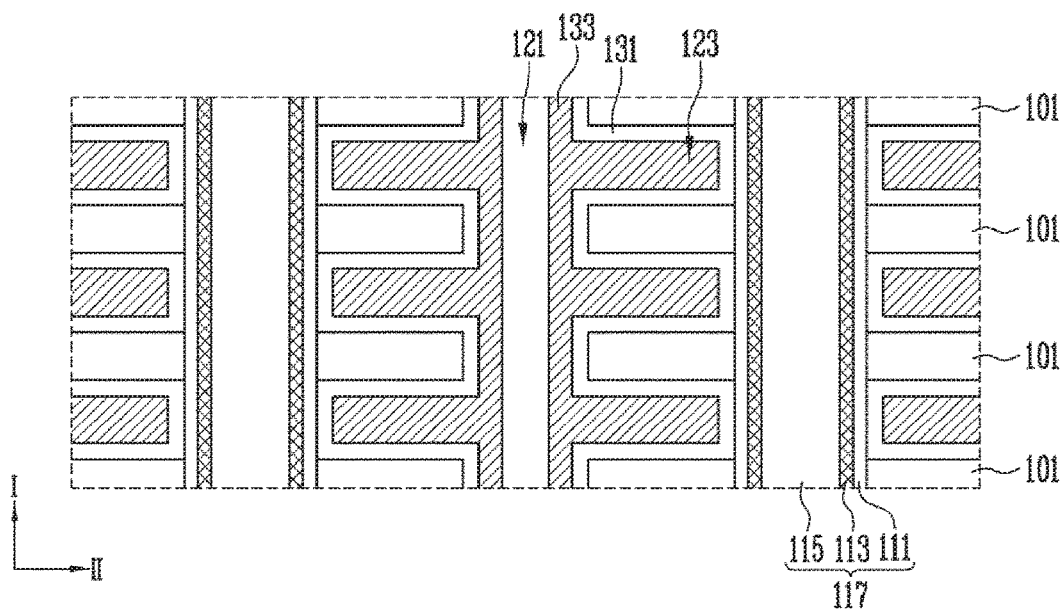

Referring to FIG. 3C, a conductive layer 133 is formed through the slit 121 so that the interlayer spaces 123 are filled with the conductive layer 133. Before the conductive layer 133 is formed, a high dielectric blocking insulating layer 131 extending from the surfaces of the interlayer spaces 123 and the surface of the slit 121 may be further formed. The high dielectric blocking insulating layer 131 may be formed of insulating material having a dielectric constant higher than that of the blocking insulating layer 111 of the cell pillar 117. For example, the high dielectric blocking insulating layer 131 may be formed of an aluminum oxide layer. The high dielectric blocking insulating layer 131 may be omitted, as needed.

The conductive layer 133 may include a barrier layer, and a metal layer formed on the barrier layer. The barrier layer may be formed of a titanium nitride layer, a tungsten nitride layer, a tantalum nitride layer, etc., so as to prevent the high dielectric blocking insulating layer 131 or the blocking insulating layer 111 from coming into direct contact with the metal layer and block diffusion of metal. The metal layer may be formed of a low-resistance material. For example, the conductive layer 133 may include a tungsten layer. A low-resistance metal layer formed of material such as tungsten may be formed using a chemical vapor deposition (CVD) method, an atomic layer deposition (ALD) method, or the like.

For example, a tungsten layer may be formed using tungsten precursor and a reducer. Tungsten hexafluoride $WF_6$ may be used as the tungsten precursor. A process of forming the conductive layer 133 may be performed at a first temperature so that the tungsten precursor may react with the reducer.

During the process of forming the conductive layer 133, a by-product may be generated in the conductive layer 133. Thus, an additional process of removing by-products generated in the conductive layer 133 may be performed. Detailed description of this process will be made with reference to FIG. 4.

The conductive layer 133 may be deposited with a thickness sufficient to fill the interlayer spaces 123 with the conductive layer 133. The conductive layer 133 may also extend on the side surface of the slit 121.

Figure 3D:
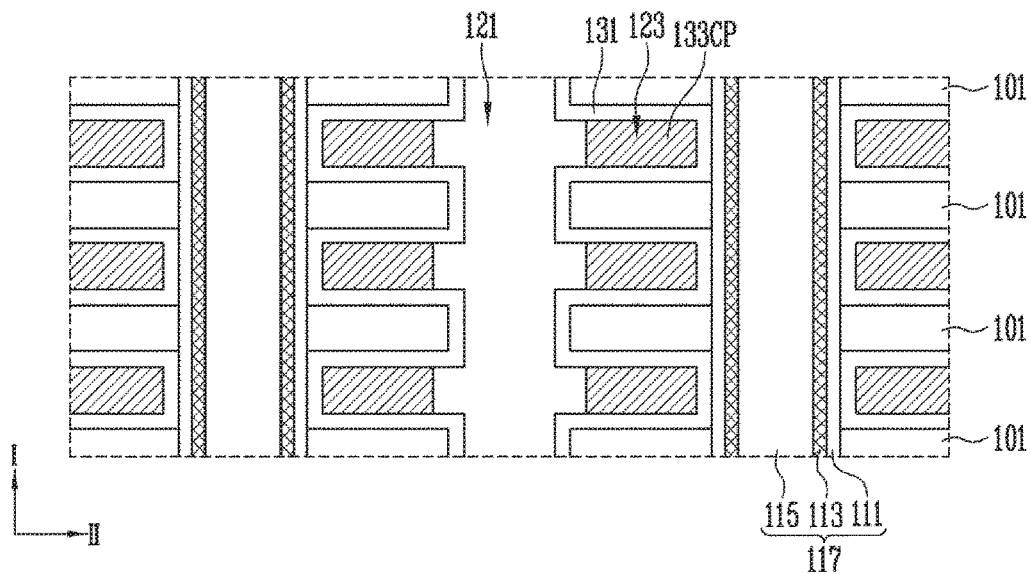

Referring to FIG. 3D, a portion of the conductive layer 133 described with reference to FIG. 3C may be etched so that the conductive layer 133 is removed from the slit 121. A process of etching the conductive layer 133 may be performed by a dry etching method or a wet etching method. The dry etching method may be performed using nitrogen trifluoride ($NF_3$), and the wet etching method may be performed without using fluorine (F). Fluorine may permeate the conductive layer 133, thus generating fumes such as HF. In an embodiment of the present disclosure, to mitigate generation of fumes which may cause voids, the wet etching method may be used to etch the conductive layer 133.

As a result of the etching process, the conductive layer 133 remain in the interlayer spaces 123 as respective conductive patterns 133CP separated from each other by the slit 121. The conductive patterns 133CP may correspond to the conductive patterns CP1 to CPn described with reference to FIGS. 1A to 1C. The conductive patterns 133CP may remain in the respective interlayer spaces 123 such that a portion of each interlayer space 123 that faces the slit 121 is open. According to this structure, the side surfaces of the interlayer insulating layers 101 may protrude toward the slit 121 further than do the side surfaces of the conductive patterns 133CP.

After the step of generating a second by-product of a gas phase by using a first by-product remaining in the conductive patterns 133CP is performed, an out-gassing process to remove the second by-product may be performed. Hereinafter, those steps will be described in detail with reference to FIGS. 5 and 6.

Figure 3E:
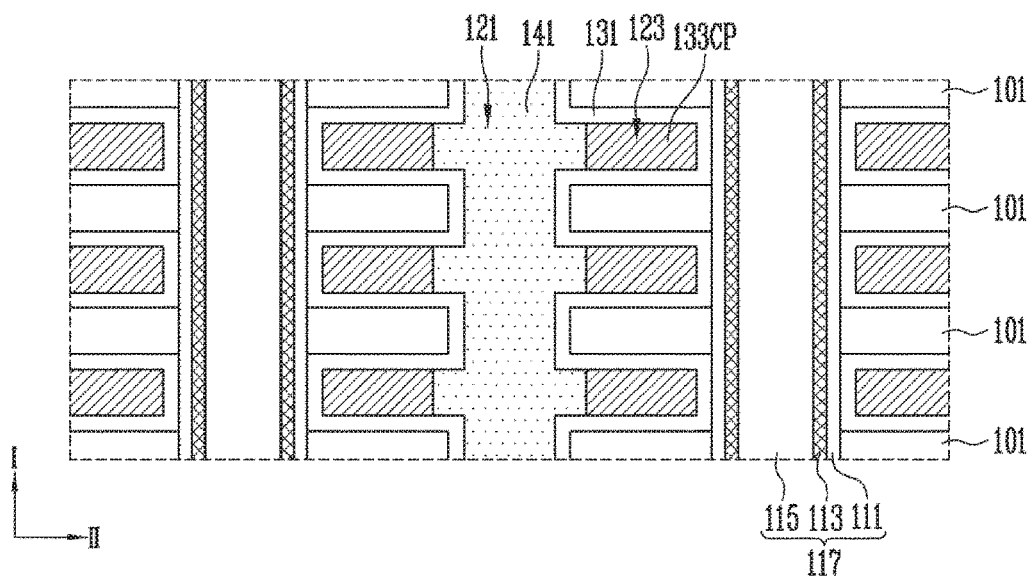

Referring to FIG. 3E, after out-gassing process to remove the second by-product is performed, the slit 121 is filled with a sealing insulating layer 141. The sealing insulating layer 141 completely covers the side surface of the slit 121 that opens the conductive patterns 133CP, so that the conductive patterns 133CP may be sealed in the respective interlayer spaces 123.

The sealing insulating layer 141 may be formed to completely fill the interior of the slit 121 or formed along the side surface of the slit 121.

Figure 4:
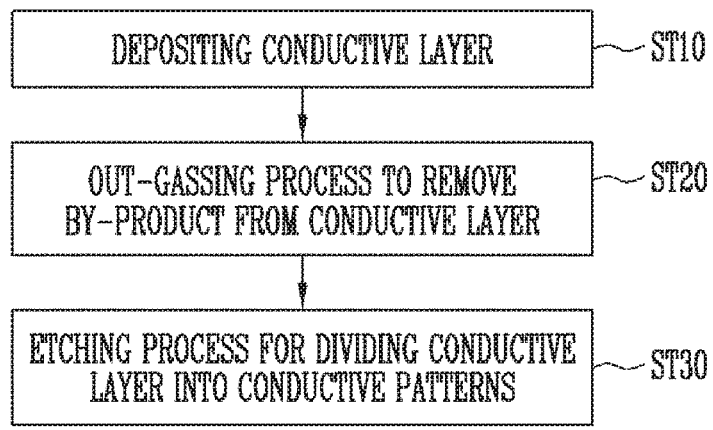
FIG. 4 is a flowchart for explaining in detail the step of removing a by-product remaining in a conductive layer.

FIG. 4 is a flowchart for explaining in detail the step of removing a by-product remaining in the conductive layer 133.

Referring to FIG. 4, step ST10 that is the step of forming the conductive layer 133 described with reference to FIG. 3C is performed. Subsequently, step ST20 may be performed before step ST30 that is the step of performing the etching process described with reference to FIG. 3D is performed. While step ST10 is performed, fluorine (F) and hydrogen (H) may remain in the conductive layer 133. The fluorine and the hydrogen may remain in the conductive layer 133 after the metal precursor (e.g., tungsten precursor) and the reducer that are used at step ST10 have reacted with each other.

Step ST20 that is an out-gassing process to remove the by-product such as fluorine and hydrogen remaining in the conductive layer 133 may be performed by supplying purge gas into a deposition chamber. Inert gas may be used as the purge gas.

Figure 5:
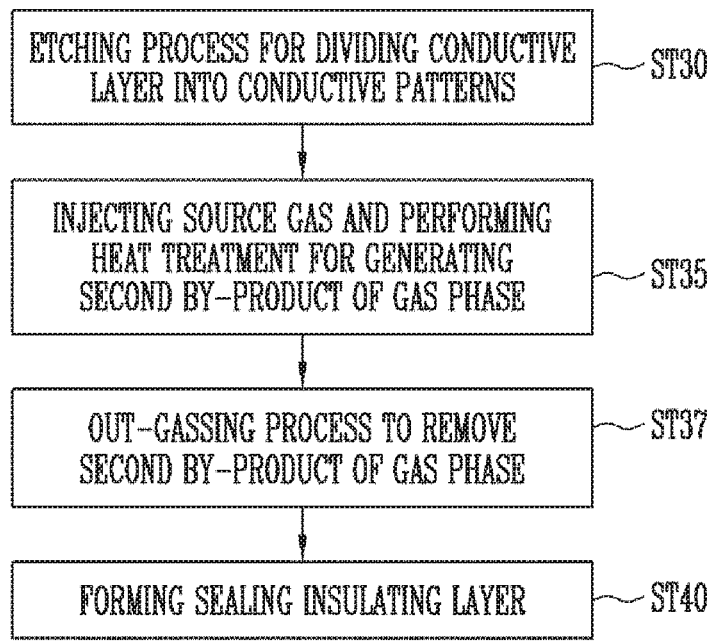
FIG. 5 is a flowchart for explaining in detail the step of removing a by-product remaining in a conductive pattern.

FIG. 5 is a flowchart for explaining in detail the process of removing the by-product remaining in the conductive patterns.

Referring to FIG. 5, the conductive patterns separated from each other by the slit may be formed at step ST30 that is the step of performing the etching process, as described with reference to FIG. 3D. The first by-product may remain in the conductive patterns. The first by-product may include fluorine and hydrogen. Although some of the fluorine and the hydrogen may be removed at step ST20 described with reference to FIG. 4, they may remain rather than being completely removed, thus causing voids in the conductive patterns. In the case where step ST30 is performed through the dry etching process using fluorine gas, fluorine may be added to the conductive patterns, thus increasing the probability of generation of voids.

In an embodiment of the present disclosure, to remove the first by-product that has been generated during the process of forming the conductive layer or the process of etching the conductive layer and remains in the conductive patterns, step ST35 and step ST37 may be performed before step ST40 of forming the sealing insulating layer is performed.

Step ST35 includes injecting source gas and heat treatment process to generate a second by-product of a gas phase using the first by-product remaining in the conductive patterns. Step ST37 is the step of performing an out-gassing process to remove the second by-product.

The source gas may include silicon-based gas. In other words, the source gas may be gas including silicon. For example, the source gas may include silane ($SiH_4$). In an embodiment, tris-dimethylamino silane {TDMAS: $SiH(N(CH_3)_2)_3$)} may be used as the source gas. The heat treatment process may be performed at a second temperature higher than the first temperature at which the conductive layer is deposited, so that the reaction of the first by-product with the source gas may be maximized. The second temperature may be controlled to be lower than the melting point of the conductive patterns and to a temperature at which the reaction of the first by-product with the source gas may be maximized. For example, the second temperature may be controlled to a range from 500° C. to 800° C. Experimental results show that when, after tungsten patterns have been formed, TDMAS source gas is injected thereto and the heat treatment process is performed at 760° C., voids formation was substantially fully prevented or voids were seldom formed, regardless of the etching method used to form the tungsten patterns or the kind of sealing insulating layer.

In the case where, at step ST35, silane-based gas is used to perform the heat treatment process, fluorine in the conductive patterns may react with the silane gas and thus generate $SiF_4$ gas as the second by-product. Furthermore, hydrogen in the conductive patterns may react with fluorine and thus generate HF gas as the second by-product.

At step ST35, the heat treatment process may be performed under vacuum conditions or an atmosphere in which N2 gas has been injected. Step ST37 may be performed by supplying inert purge gas.

After step ST37, step 40 of forming the sealing insulating layers described with reference to FIG. 3E may be performed. In an embodiment of the present disclosure, the first by-product in the conductive patterns reacts in advance with source gas provided at step ST35 and then is out-gassed from the reaction chamber at step ST37. Consequently, step ST40 may be performed under conditions in which there is seldom any first by-product in the conductive patterns. Therefore, although silicon-based gas is used as the material of the sealing insulating layer to form the sealing insulating layer including silicon, there is low possibility of generation of fumes by reaction of the material of the sealing insulating layer with the by-product in the conductive patterns. As a result, a silicon-based sealing insulating layer such as a silicon oxide layer or a silicon nitride layer may be formed using silicon as the material of the sealing insulating layer.

In the case where silicon-based source gas is used as the sealing insulating layer, step ST35, step ST37, and step ST40 may be performed in an in-situ manner in the same chamber. In this way, the method of manufacturing the semiconductor device in accordance with embodiments of the present disclosure may simplify the process of manufacturing the semiconductor device and minimize a phenomenon in which the conductive patterns are exposed to the atmosphere. At least one of $SiO_2$, $Si_xN_y$ (x: 0.1% to 99%, y: 100%-x %), and $Si_xO_yN_z$ (x: 0.1% to 99%, y: 100%-x %, z: 100%-x %-y %) may be used as the silicon-based insulating layer.

The sealing insulating layer is not limited to the silicon-based insulating layer. For example, the sealing insulating layer may include an insulating layer such as a metal insulating layer having a high dielectric constant. For instance, the sealing insulating layer may include at least one of $HfO_2$, $Al_2O_3$, $ZrO_2$, HfON, HfSiO, HfSiON, AION, ZrON, ZrSiO, ZrSiON, $TiO_2$, TION and $Ta_xO_y$ (x: 0.1% to 99%, y: 100%-x %).

In an embodiment, step ST35 and step ST37 described with reference to FIG. 5 may be performed without step ST20 described with reference to FIG. 4.

Figure 6:
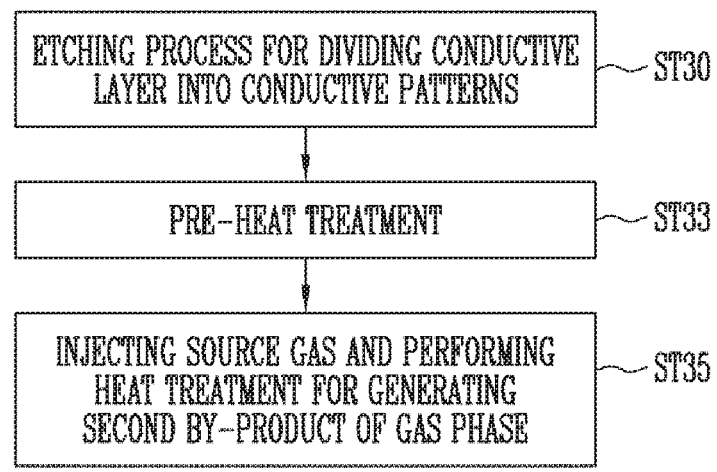
FIG. 6 is a flowchart for explaining an additional process that may be provided to remove the by-product remaining in the conductive pattern.

FIG. 6 is a flowchart for explaining an additional process that may be provided to remove the by-product remaining in the conductive patterns.

To more efficiently remove the first by-product, step ST33 that is a pre-heat treatment step may be additionally performed between step ST30 and step ST35. Step ST33 may be performed by a furnace annealing method or a rapid thermal annealing (RTA) method. Some of the first by-product may be removed from the conductive patterns through step ST33. Step ST33 may be performed under a vacuum atmosphere or an atmosphere in which N2 gas has been injected.

In accordance with embodiments of the present disclosure, by-products which may cause voids if they remain in the conductive patterns may be efficiently removed, so that each of the conductive patterns sealed in the interlayer spaces by the sealing insulating layer may have a relatively large volume substantially free of voids. Furthermore, the present disclosure may mitigate a bridge error which may be caused when voids remain in the conductive patterns. The present disclosure may mitigate a bridge error or a void error, thus making it possible to provide normal resistances of the conductive patterns, and facilitating analysis on characteristics of the conductive patterns.

Figure 7:
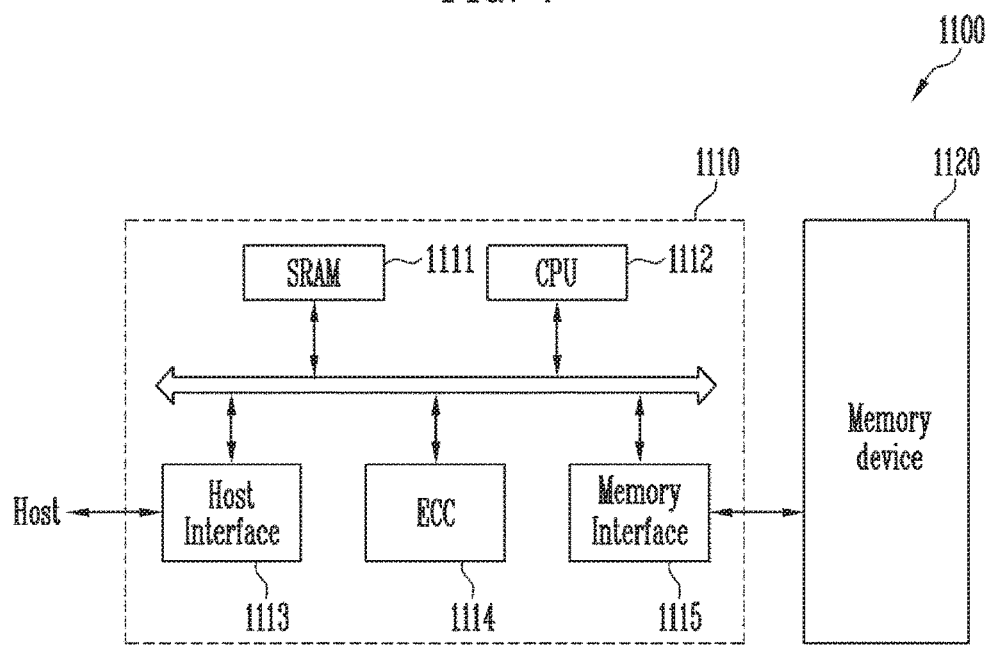
FIG. 7 is a block diagram illustrating a memory system in accordance with an embodiment of the present disclosure.

FIG. 7 is a block diagram illustrating a memory system 1100 in accordance with an embodiment of the present disclosure.

Referring FIG. 7, the memory system 1100 in accordance with an embodiment includes a memory device 1120 and a memory controller 1110.

The memory device 1120 may include at least one of the structures described with reference to FIGS. 1A to 1C and may be formed through the method described with reference to FIGS. 3A to 6.

The memory device 1120 may be a mufti-chip package formed of a plurality of memory chips. In accordance with embodiments of the present disclosure, resistances of conductive patterns that form a chip may be reduced without an increase in size of the chip, and a bridge error between different conductive patterns may be mitigated.

The memory controller 1110 is configured to control the memory device 1120, and may include a static random access memory (SRAM) 1111, a CPU 1112, a host interface 1113, an error correction code (ECC) 1114, and a memory interface 1115. The SRAM 1111 may be used as an operating memory of the CPU 1112. The CPU 1112 may perform overall control operations for data exchange of the memory controller 1110. The host interface 1113 may be provided with a data interchange protocol of a host coupled with the memory system 1100. Furthermore, the ECC 1114 may detect and correct an error included in the data that is read from the memory device 1120, and the memory interface 1115 may interface with the memory device 1120. In addition, the memory controller 1110 may further include a read only memory (ROM) or the like that stores code data for interfacing with the host.

The above-described memory system 1100 may be a memory card or a solid state disk (SSD) equipped with the memory device 1120 and the controller 1110. For example, when the memory system 1100 is an SSD, the memory controller 1110 may communicate with an external device (e.g., a host) via one of various interface protocols, such as a universal serial bus (USB), a multimedia card (MMC), a peripheral component interconnection-express (PCI-E), a serial advanced technology attachment (SATA), a parallel advanced technology attachment (DATA), a small computer small interface (SCSI), an enhanced small disk interface (ESDI), and an integrated drive electronics (IDE).

Figure 8:
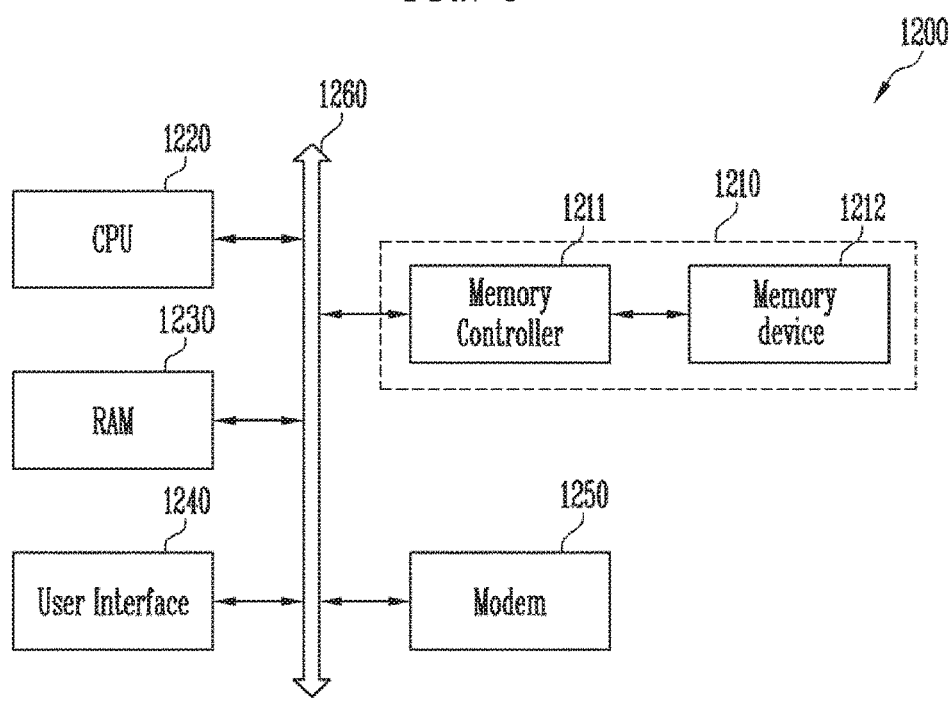
FIG. 8 is a block diagram illustrating a computing system including the memory system illustrated with reference to FIG. 7.

FIG. 8 is a block diagram illustrating a computing system 1200 including the memory system illustrated with reference to FIG. 7.

Referring to FIG. 8, the computing system 1200 in accordance with the embodiment of the present disclosure may include a CPU 1220, a random access memory (RAM) 1230, a user interface 1240, a modem 1250, and a memory system 1210 that are electrically coupled to a system bus 1260. Furthermore, if the computing system 1200 is a mobile device, it may further include a battery for supplying operating voltage to the computing system 1200. An application chip set, a camera image processor CIS, a mobile DRAM and the like may be further included.

The memory system 1210 may be configured with the memory device 1212 and the memory controller 1211 which may correspond to the memory device 1120 and the memory controller 1110 of FIG. 7.

As described by way of exemplary embodiments, the present invention provides a manufacturing method for a semiconductor device capable of reducing or substantially preventing the generation of voids in the conductive patterns of the semiconductor device. The method includes removing by-products which remain in the conductive patterns after the conductive patterns have been patterned. The present invention may improve the operating characteristics of the semiconductor device by reducing defects of the conductive patterns.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A method of manufacturing a semiconductor device, comprising:
forming conductive patterns in interlayer spaces between interlayer insulating layers, the conductive patterns being separated from each other by a slit passing through the interlayer insulating layers, wherein the conductive patterns include a first by-product;
generating a second by-product of a gas phase by reacting the first by-product remaining in the conductive patterns with a source gas;
performing an out-gassing process to remove the second by-product; and
filling the slit with a sealing insulating layer so that the conductive patterns are sealed in the interlayer spaces.

2. The method according to claim 1, wherein the forming of the conductive patterns separated from each other by the slit comprises:
alternately stacking sacrificial layers and the interlayer insulating layers;
forming the slit passing through the sacrificial layers and the interlayer insulating layers;
removing the sacrificial layers through the slit to expose the interlayer spaces; and
filling the interlayer spaces with a conductive layer through the slit.

3. The method according to claim 2, further comprising dividing the conductive layer into the conductive patterns by removing a portion of the conductive layer in the slit through a wet etching process.

4. The method according to claim 3, further comprising:
forming a hole passing through the sacrificial layers and the interlayer insulating layers; and
forming a channel layer in the hole.

5. The method according to claim 2, wherein the forming of the conductive layer comprises depositing a tungsten layer using a tungsten precursor.

6. The method according to claim 2,
wherein the forming of the conductive layer is performed at a first temperature, and
wherein the generating of the second by-product is performed at a second temperature higher than the first temperature.

7. The method according to claim 1, wherein the generating of the second by-product comprises:
injecting the source gas; and
performing a heat treatment process within a range from 500° C. to 800° C.

8. The method according to claim 1, wherein the source gas includes silane.

9. The method according to claim 1, wherein the source gas includes tris dimethylamino silane (TDMAS).

10. The method according to claim 1, wherein the second by-product includes any one of HF and $SiF_4$.

11. The method according to claim 1, further comprising, before the generating of the second by-product, performing a pre-heat treatment process for removing some of the first by-product.

12. The method according to claim 1, wherein an inert purge gas is supplied during the removing of the second by-product.

13. The method according to claim 1, wherein the generating of the second by-product, the out-gassing process to remove the second by-product, and the forming of the sealing insulating layer are performed in an in-situ manner.

14. The method according to claim 1, wherein the sealing insulating layer is formed using the source gas.

15. The method according to claim 1, wherein the sealing insulating layer is formed of a silicon-based insulating layer.

16. The method according to claim 1, wherein the sealing insulating layer includes at least one of $SiO_2$, $Si_xN_y$, $Si_xO_yN_z$, $HfO_2$, $Al_2O_3$, $ZrO_2$, HfON, HfSiO, HfSiON, AlON, ZrON, ZrSiO, ZrSiON, $TiO_2$, TiON, and $Ta_xO_y$.

17. A method of manufacturing a semiconductor device, comprising:
forming interlayer insulating layers penetrated by a slit and stacked and spaced apart from each other with an interlayer space interposed therebetween;
depositing a conductive layer with which the interlayer space is filled, wherein the conductive layer is deposited at a first temperature;
removing a portion of the conductive layer in the slit through an etching process such that the conductive layer remains as a conductive pattern within the interlayer space;
reacting a first by-product remaining in the conductive pattern with a source gas at a second temperature higher than the first temperature to form a second by-product of a gas phase; and
performing an out-gassing process to remove the second by-product.

18. A method of manufacturing a semiconductor device, comprising:
forming conductive layers in interlayer spaces between interlayer insulating layers, wherein the conductive layers include a first by-product;
generating a second by-product of a gas phase by reacting the first by-product remaining in the conductive layers with a source gas; and
performing an out-gassing process to remove the second by-product.

19. The method according to claim 18, wherein the conductive layers are separated from each other by a slit passing through the interlayer insulating layers.

* * * * *